United States Patent
Nunes et al.

(10) Patent No.: US 8,657,959 B2
(45) Date of Patent: Feb. 25, 2014

(54) APPARATUS FOR ATOMIC LAYER DEPOSITION ON A MOVING SUBSTRATE

(75) Inventors: Geoffrey Nunes, Swarthmore, PA (US); Richard Dale Kinard, Wilmington, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 264 days.

(21) Appl. No.: 12/970,198

(22) Filed: Dec. 16, 2010

(65) Prior Publication Data

US 2011/0086167 A1 Apr. 14, 2011

Related U.S. Application Data

(63) Continuation-in-part of application No. 12/550,706, filed on Aug. 31, 2009, now abandoned.

(60) Provisional application No. 61/230,336, filed on Jul. 31, 2009.

(51) Int. Cl.
| | |
|---|---|
| *C23C 16/00* | (2006.01) |
| *B05C 11/00* | (2006.01) |
| *H01L 21/469* | (2006.01) |
| *C23C 8/00* | (2006.01) |

(52) U.S. Cl.
USPC .............. 118/729; 118/58; 118/718; 95/273; 438/765; 438/784; 427/249.17; 427/255.5; 427/585; 427/586

(58) Field of Classification Search
USPC .............. 118/58, 500, 715; 95/273; 438/765, 438/784; 427/585, 586
See application file for complete search history.

(56) References Cited

U.S. PATENT DOCUMENTS

| 4,389,973 A | 6/1983 | Suntola et al. |
| 4,413,022 A | 11/1983 | Suntola et al. |

(Continued)

FOREIGN PATENT DOCUMENTS

| WO | 2008085467 | 12/2007 |
| WO | 2008027215 A2 | 3/2008 |

OTHER PUBLICATIONS

International Search Report PCT/US2010/043888, Dated Sep. 22, 2010.

(Continued)

*Primary Examiner* — Dah-Wei Yuan
*Assistant Examiner* — Karl Kurple

(57) ABSTRACT

An apparatus for atomic layer deposition of a material on a moving substrate comprises a conveying arrangement for moving a substrate along a predetermined planar or curved path of travel and a coating bar having at least one precursor delivery channel. The precursor delivery channel conducts a fluid containing a material to be deposited on a substrate toward the path of travel. When in use, a substrate movable along the path of travel defines a gap between the outlet end of the precursor delivery channel and the substrate. The gap defines an impedance $Z_g$ to a flow of fluid from the precursor delivery channel. A flow restrictor is disposed within the precursor delivery channel that presents a predetermined impedance $Z_{fc}$ to the flow therethrough. The restrictor is sized such that the impedance $Z_{fc}$ is at least five (5) times, and more preferably at least fifteen (15) times, the impedance $Z_g$. The impedance $Z_{fc}$ has a friction factor f. The restrictor in the precursor delivery channel is sized such that the impedance $Z_{fc}$ has a friction factor f that is less than 100, and preferably less than 10.

20 Claims, 17 Drawing Sheets

(56) References Cited

U.S. PATENT DOCUMENTS

| | | | |
|---|---|---|---|
| 5,835,884 A * | 11/1998 | Brown | 702/45 |
| 6,126,753 A * | 10/2000 | Shinriki et al. | 118/715 |
| 6,306,216 B1 * | 10/2001 | Kim et al. | 118/725 |
| 6,777,352 B2 * | 8/2004 | Tepman et al. | 438/784 |
| 6,821,563 B2 * | 11/2004 | Yudovsky | 438/758 |
| 6,942,753 B2 * | 9/2005 | Choi et al. | 156/345.34 |
| 7,141,095 B2 * | 11/2006 | Aitchison et al. | 95/273 |
| 7,413,982 B2 | 8/2008 | Levy et al. | |
| 7,456,429 B2 | 11/2008 | Levy et al. | |
| 7,635,502 B2 * | 12/2009 | Sneh | 427/248.1 |
| 8,333,839 B2 * | 12/2012 | Oh | 118/718 |
| 2004/0067641 A1 | 4/2004 | Yudovsky | |
| 2007/0224348 A1 | 9/2007 | Dickey et al. | |
| 2007/0281089 A1 | 12/2007 | Heller et al. | |
| 2008/0166880 A1 | 7/2008 | Levy | |
| 2008/0166884 A1 * | 7/2008 | Nelson et al. | 438/765 |
| 2009/0013858 A1 | 1/2009 | Obermeier | |
| 2009/0074627 A1 * | 3/2009 | Fitzgerald et al. | 422/129 |
| 2009/0078204 A1 | 3/2009 | Kerr et al. | |
| 2009/0081366 A1 | 3/2009 | Kerr et al. | |
| 2009/0081885 A1 | 3/2009 | Levy et al. | |
| 2009/0081886 A1 | 3/2009 | Levy et al. | |
| 2009/0165715 A1 | 7/2009 | Oh | |
| 2009/0326279 A1 * | 12/2009 | Tonkovich et al. | 568/487 |

OTHER PUBLICATIONS

Taylor et al, Characterization of the Effect of Surface Roughness and Texture on Fluid Flow-Past, Present, and Future, International Journal of Thermal Sciences, 2006, vol. 45, pp. 962-968.

* cited by examiner

APPARATUS FOR ATOMIC LAYER DEPOSITION ON A MOVING SUBSTRATE

CLAIM OF PRIORITY

This application is a continuation-in-part of parent application Ser. No. 12/550,706, filed Aug. 31, 2009 now abandoned, which itself claimed priority of and incorporated by reference thereinto U.S. Provisional Application titled "Apparatus For Atomic Layer Deposition", Ser. No. 61/230,336, filed Jul. 31, 2009.

BACKGROUND OF THE INVENTION

1. Field of the Invention

This invention relates to an apparatus for atomic layer deposition of material(s) on a substrate.

2. Description of the Art

Atomic layer deposition ("ALD") is a thin film deposition technique that offers extremely precise control over the thickness of a layer of a compound material deposited on a substrate. As the name implies, the film growth in ALD is layer by layer, which allows the deposition of extremely thin, conformal coatings that are also free of grain boundaries and pinholes. Deposition of this coating is typically done through the application of two molecular precursors. The surface of the substrate is exposed to a first precursor ("precursor I") molecule, which reacts chemically with the surface. This reaction is self-limiting and proceeds until there is a uniform monolayer coating of reacted precursor I covering the surface. The surface is then exposed to a second precursor ("precursor II"), which reacts chemically with the surface coated with precursor I to form the desired compound. As before, the reaction is self limiting, and the result is a completed monolayer coating of reacted precursor II covering the surface, and therefore a completed monolayer of the desired compound material.

The process can then be repeated, exposing the surface first to precursor I and then to precursor II, until a coating of the desired thickness has been formed. Since each completed I-II layer has a thickness on the order of 0.1 nm, very thin layers, with a very precisely controlled thickness are possible.

Historically, ALD has been carried out by placing the substrate to be coated in a vacuum chamber and introducing a low pressure carrier gas containing some small percentage of precursor, also in the gas phase. However, because the time to completely purge the precursors from the deposition chamber can be long, ALD has typically been regarded as a slow process.

An alternative form of ALD coating head is known that allows deposition at much higher rates. In this head arrangement the precursor gases (again, precursor molecules in an inert carrier gas) are delivered by long narrow channels, and these channels alternate with vacuum uptake channels and purge gas channels. The head is then traversed across the substrate to be coated in a direction perpendicular to the long axis of the output channels (or alternatively held in one position while the substrate is translated underneath it). U.S. Published Patent Application 2008/166,880 (Levy) is representative of the structure of such a head.

The head disclosed in this referenced published application requires that the separation between the head and the substrate be very small (~thirty microns) and very closely controlled. In fact, jets of gas emanating from the face of the device are used as a means to float the coating head, in a manner analogous to a hovercraft, over the substrate to be coated.

In view of the foregoing it is believed to be advantageous to provide an apparatus for ALD coating of a substrate that is not sensitive to the precise distance between the coating head and the substrate, but is, instead, independent of the separation between the head and the substrate and tolerant of dimensional variations in that separation. In that way, no extraordinary measures would be needed to keep this separation distance fixed. In particular, it is believed to be advantageous not to require the gases exiting the head to do double duty: i.e., the gases should not be required to serve the function of maintaining a fixed separation at the cost of compromising the main function of the device, the deposition of an ALD coating.

SUMMARY OF THE INVENTION

The present invention is directed to an apparatus for atomic layer deposition of a material on a moving substrate comprising a conveying arrangement for moving a substrate along a predetermined path of travel through the apparatus and a coating bar having at least one precursor delivery channel. The precursor delivery channel is able to conduct a fluid containing a material to be deposited on a substrate toward the path of travel. When in use, a substrate movable along the path of travel defines a gap between the outlet end of the precursor delivery channel and the substrate. The gap defines an impedance $Z_g$ to a flow of fluid from the precursor delivery channel.

The apparatus further comprises a flow restrictor disposed within the precursor delivery channel. The flow restrictor presents a predetermined impedance $Z_{fc}$ to the flow in the precursor delivery channel. The restrictor is sized such that the impedance $Z_{fc}$ is at least five (5) times, and more preferably at least fifteen (15) times, the impedance $Z_g$.

The impedance $Z_{fc}$ has a friction factor f. The restrictor in the precursor delivery channel is sized such that the impedance $Z_{fc}$ has a friction factor f that is less than 100, and preferably less than 10.

The coating bar also has first and second inert gas delivery channels respectively disposed on the upstream and downstream sides of the precursor delivery channel.

The outlet end of each inert gas delivery channel also defines a gap between the end of each inert gas flow delivery channel and the substrate. Each gap defines an impedance $Z'_g$ to a flow of fluid from each respective inert gas delivery channel. A flow restrictor is disposed within each inert gas delivery channel. Each flow restrictor presents a predetermined impedance $Z'_{fc}$ to the flow in the respective inert gas delivery channel. Each restrictor within each inert gas delivery channel is sized such that the impedance $Z'_{fc}$ is at least five (5) times, and more preferably at least fifteen (15) times, the impedance $Z'_g$. The impedance $Z'_{fc}$ has a friction factor f'. The restrictor in the inert gas delivery channel is sized such that the impedance $Z'_{fc}$ has a friction factor f' that is less than 100, and preferably less than 10.

The coating bar also has first and second exhaust channels defined therein, each exhaust channel being interposed between the precursor delivery channel and one of the inert gas delivery channels. Each exhaust channel has an inlet end. The inlet end of each exhaust channel is in fluid communication with both the gap having the impedance $Z_g$ and with the gap having the impedance $Z'_g$ so that each exhaust channel is able to conduct fluid from both the precursor delivery channel and from one of the inert gas delivery channels away from the path of travel. A flow restrictor is disposed within each exhaust channel, each flow restrictor presenting a predetermined impedance $Z''_{fc}$ to the flow in the respective exhaust channel. The impedance $Z''_{fc}$ having a friction factor f''. Each restrictor within each exhaust channel is sized such that its impedance $Z''_{fc}$ is at least five (5) times larger than either the impedance $Z_g$ or the impedance $Z'_g$. More preferably, each impedance $Z''_{fc}$ is at least fifteen (15) times larger than either the impedance $Z_g$ or the impedance $Z'_g$. The restrictor in each exhaust channel is sized such that the friction factor f" that is less than 100, and preferably less than 10.

The path of travel of the substrate through the apparatus could be a planar or a curved path of travel.

BRIEF DESCRIPTION OF THE DRAWINGS

The invention will be more fully understood from the following detailed description taken in connection with the accompanying Figures, which form a part of this application and in which.

DETAILED DESCRIPTION OF THE INVENTION

Figure 1:
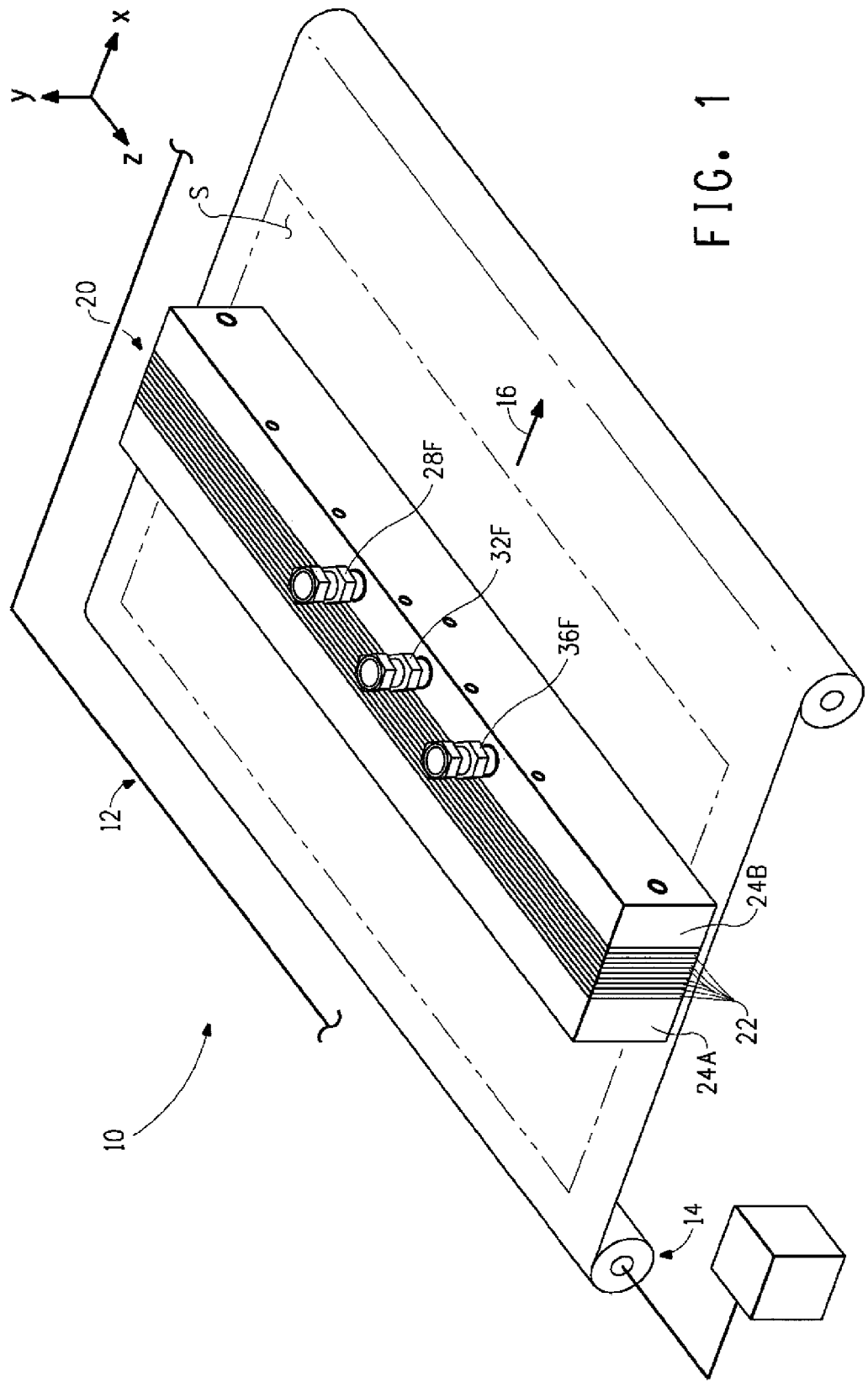
FIG. 1 is a stylized diagrammatic representation of an apparatus for continuous flow atomic layer deposition of at least one precursor material on a moving substrate, the apparatus incorporating a coating bar in accordance with the present invention.

Throughout the following detailed description similar reference numerals refer to similar elements in all figures of the drawings.

FIG. 1 is a stylized diagrammatic representation of an apparatus generally indicated by the reference character 10 for continuous flow atomic layer deposition of at least one precursor material onto a moving substrate S. The substrate S can be a rigid material, such as a glass plate, or a flexible material, such as a flexible polymer or metallic web. The apparatus 10 includes a suitable enclosure diagrammatically by reference character 12.

A conveying arrangement 14 is provided within the enclosure 12 for moving the substrate S along a predetermined path of travel 16 through the apparatus 10. In the arrangement illustrated in FIGS. 1 and 2 the substrate S is moved by the conveying arrangement 14 along the positive X-axis of the reference coordinate system indicated in the drawing. The path of travel 16 of the substrate S is generally planar, lying substantially in the X-Z reference plane. The purpose of the enclosure 12 is to contain an inert atmosphere and to allow operation of the apparatus at elevated temperatures.

Figure 2:
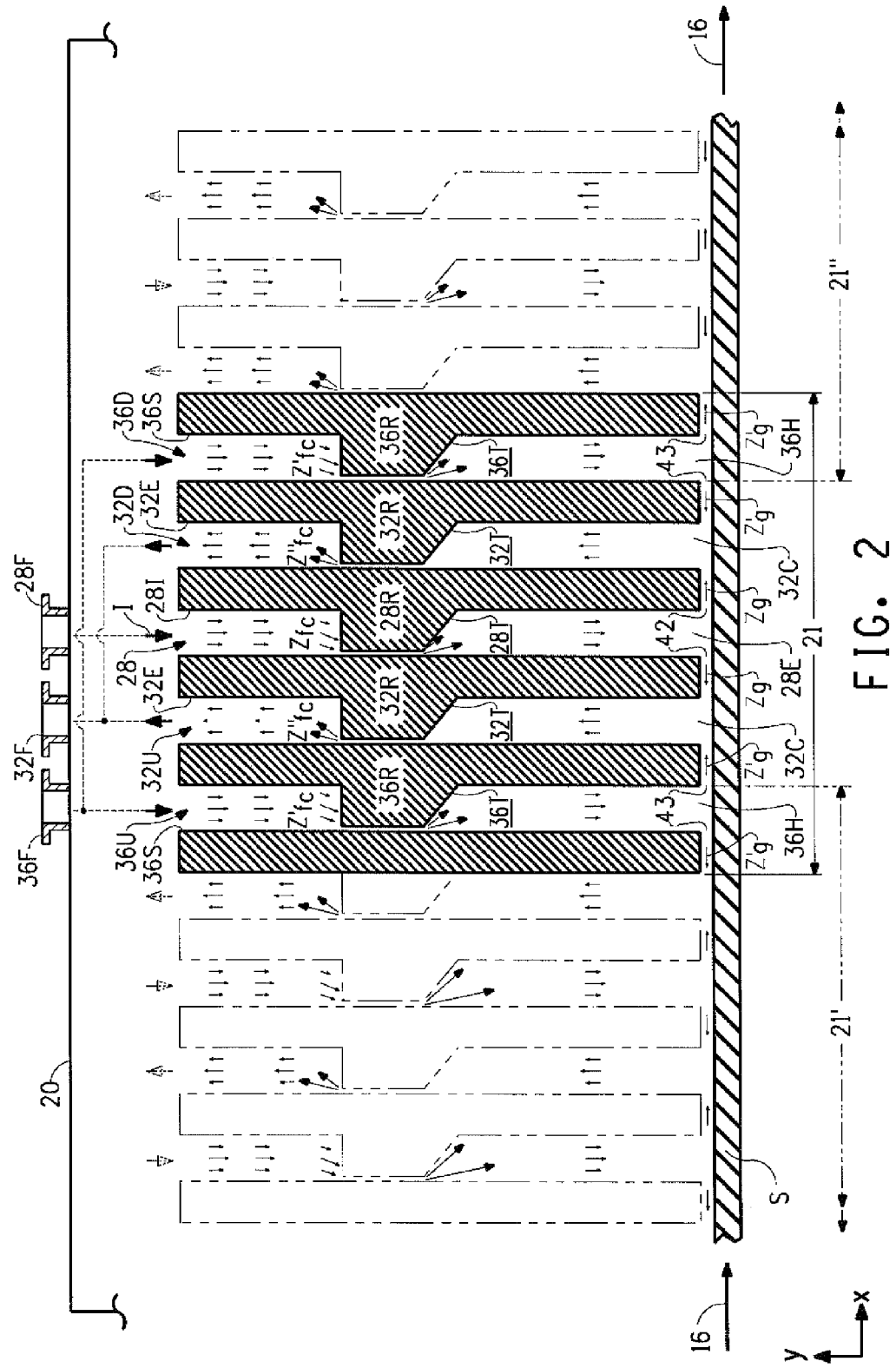
FIG. 2 is diagrammatic side section view of the basic structural elements of a coating bar in accordance with the present invention.

The apparatus 10 incorporates at least one coating bar 20 in accordance with the present invention. FIG. 2 is a diagrammatic side section view of the basic structural elements of a coating bar 20 from which an understanding of the operation of the bar 20 may be obtained.

As illustrated in FIGS. 1 and 2 the bar 20 is a generally rectanguloid member configured to provide the various internal fluid delivery and removal channels whereby at least one precursor material is able to be deposited onto the surface of the substrate S as the substrate S is conveyed along the path of travel 16 through the apparatus 10. The set of the various fluid delivery and exhaust channels necessary to deposit at least one precursor material are grouped together as a precursor deposition module 21 illustrated in solid lines in FIG. 2. As suggested by phantom lines in FIG. 2 and as will be developed in connection with FIG. 4, multiple precursor deposition modules (depicted for example by the reference characters 21', 21") may be included in a bar 20' (FIG. 4) so that a given bar is able to deposit two or more precursors on a substrate being transported beneath the bar.

There is an advantageous efficiency in combining multiple deposition modules (e.g., modules 21, 21", FIG. 2) into a single coating bar. If, for example, a first module 21 containing a precursor delivery channel 28, a pair of exhaust (or vacuum) channels 32U and 32D, and a pair of inert gas delivery, or "purge" channels 36U and 36D, is juxtaposed next to a second, identical module 21", then the downstream purge channel 36D of the first module 21 may also serve as the upstream purge channel 36U of the second module 21". In that way, if a coating bar contains N number of deposition modules 21, it need only contain a total of (N+1) number of purge channels 36.

Structurally, the precursor deposition module 21 within the bar 20 can be constructed in any convenient manner. For example, in the embodiments depicted in this application the precursor deposition module 21 is formed as a layered stack of structural plates 22 bolted between end members 24A, 24B. As will be discussed in more detail each of the plates 22 is configured such that when the sandwich is assembled the space between adjacent plates 22 defines the various internal channels to be explained herein. In addition, the plates have appropriately positioned openings that cooperate to define the necessary supply headers and fluid transport passages within the bar 20.

In its most basic form a precursor deposition module 21 able to deposit a single precursor on a substrate is configured to include a precursor delivery channel 28, a pair of exhaust channels 32, and a pair of inert gas delivery, or "purge" channels 36. Flow arrows depict the direction of the fluid flow in each of the channels as will be described. The precursor delivery channel 28, each of the exhaust channels 32, and the inert gas delivery channels 36 all have a predetermined width dimension (measured in the X-direction) on the order of 0.5 to two (2) millimeters, and typically approximately one (1) millimeter.

The precursor delivery channel 28 has an inlet end 28I and an outlet end 28E. As shown by the flow arrows the precursor delivery channel 28 conducts a flow of a fluid containing a precursor material ("I") supplied at the inlet end 28I of the channel 28 toward the outlet end 28E thereof. The inlet end 28I of the precursor delivery channel 28 is connected to a supply fitting indicated by the reference character 28F. Precursor material carried in the flow exiting from the outlet end 28E of the channel 28 is deposited on the substrate S as the substrate S moves beneath the bar.

An upstream exhaust channel 32U and a downstream exhaust channel 32D respectively flank the precursor delivery channel 28 on both its upstream and downstream sides. As generally used herein the terms "upstream" and "downstream" are defined relative to the direction 16 of the substrate S along its path of travel through the apparatus 10 and respectively correspond to negative and positive directions along the reference X-axis. Each exhaust channel 32U, 32D has a collection end 32C and an exhaust end 32E. The collection end 32C of each exhaust channel 32 is adjacent to the path of travel of the substrate S. The exhaust end 32E of each of the exhaust channels 32U, 32D is connected to a common exhaust fitting diagrammatically indicated by the reference character 32F.

The coating bar 20 further includes upstream and downstream inert gas delivery (or "purge") channels 36U, 36D, respectively. As illustrated, the purge channel 36U is deployed immediately upstream of the upstream exhaust channel 32U, while the purge channel 36D is deployed immediately downstream of the downstream exhaust channel 36D. Thus, each of the exhaust channels 32U, 32D is disposed between the precursor delivery channel 28 and the upstream and downstream inert gas delivery (purge) channels 36U, 36D, respectively. Each purge channel 36U, 36D serves to deliver an inert fluid, such as nitrogen gas, from a supply end 36S to a discharge end 36H located adjacent to the path of travel of the substrate S. The supply end 36S of each purge channel 36 is connected to a common supply fitting diagrammatically indicated by the reference character 36F.

The outlet end 28E of the precursor delivery channel 28, the collection end 32C of each respective exhaust channel 32U, 32D, as well as the discharge end 36H of each respective purge channel 36U, 36D, all have a transverse dimension (extending the positive Z-direction) that encompasses the entire transverse dimension of the substrate S.

Figure 3:
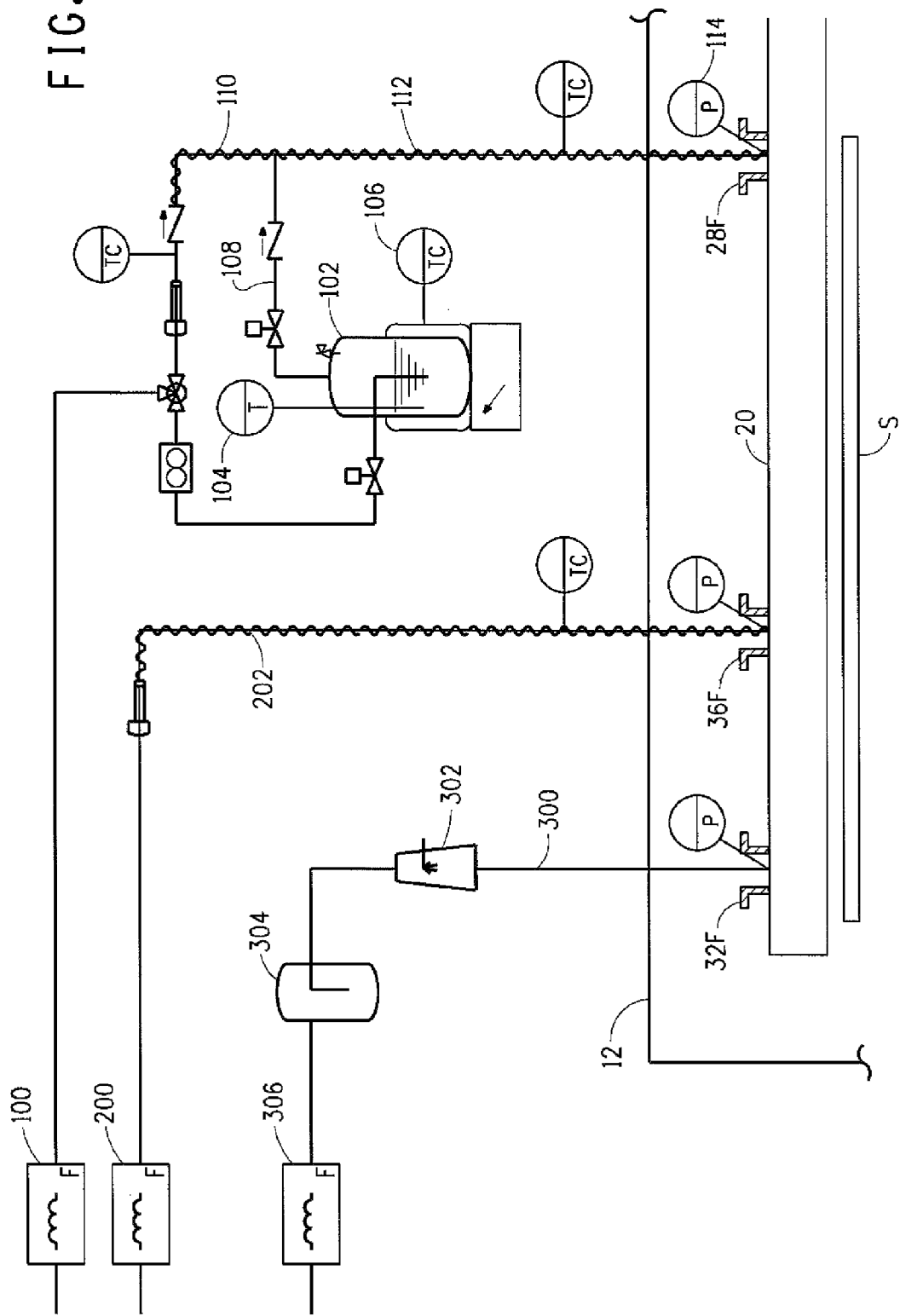
FIG. 3 is a block diagram of a control system for a coating apparatus having a coating bar in accordance with the present invention.

FIG. 3 is a block diagram of the control system for the operation of the apparatus 10. An input flow of nitrogen is provided by the controller 100 and directed to a bubbler 102 containing a precursor material (e.g., material "I"). The temperature of the precursor is monitored via a sensor 104 and controlled via a temperature controller 106. The nitrogen gas, saturated with precursor, exits the bubbler via a line 108 and is optionally combined with a pure nitrogen stream 110. The combined stream, containing precursor at the desired concentration, travels through a temperature controlled line 112 to the precursor inlet connection fitting 28F in the coating bar 20. The pressure of the gas delivered to the coating bar 20 is monitored via a pressure gauge 114. A second input flow of nitrogen is provided by the controller 200 and is delivered to the purge inlet connection fitting 36F of the coating bar 20 via the temperature controlled line 202. A line 300 directs the outflow from the exhaust connection fitting 32F on the coating bar 20 to a spray box 302 and subsequently to a cold trap 304. The rate at which exhaust gas drawn from the apparatus is regulated by the vacuum flow controller 306.

In operation, a gas containing a precursor material (material "I") is supplied via the fitting 28F to the precursor delivery channel 28. The precursor material is conducted through the precursor delivery channel 28 toward the outlet end 28E thereof. At the outlet end 28E the flow of precursor gas exits the precursor delivery channel 28 and is drawn into a gap 42 defined between the edges of the plates 22 forming the delivery channel 28 and the substrate S. The gap 42 defines an impedance $Z_g$ to a flow of fluid from the precursor delivery channel. The magnitude of the impedance $Z_g$ is directly controlled by the size of the gap 42.

Simultaneously, a flow of inert gas is introduced via the supply fitting 36F into each of the purge channels 36U, 36D. Each of these flows is conducted toward the respective discharge end 36H of these channels. The inert gas flows are similarly drawn into gaps 43 defined between the edge of the plates 22 forming these channels and the substrate S. These gaps 43 similarly define an impedance $Z'_g$ to a flow of fluid from the inert gas delivery channels. The size of the gap 43 directly controls the magnitude of the impedance $Z'_g$.

The collection end 32C of each exhaust channel 32U, 32D communicates with the gaps 42, 43 to which they are proximal. Thus, the precursor gas flow as well as the inert gas flows are drawn through the respective gaps 42, 43, and collected by the collection ends 32C of each of the exhaust channels 32U, 32D. As the precursor flow squeezes through the gap 42 into one of the exhaust channels 32U, 32D a layer of precursor "I" material is deposited on the substrate S.

For reasons which shall be described herein the precursor delivery channel 28, each of the inert gas delivery channels 32U and 32D, and each of exhaust flow channels 36U and 36D, is provided with a flow restrictor therein. The flow restrictor in the precursor delivery channel 28 is indicated by the reference character 28R, while the flow restrictors in the inert gas delivery channels 32U and 32D are indicated by the reference character 32R, and the flow restrictors in the exhaust channels 36U, 36D are indicated by the reference characters 36R. The presence of the flow restrictor 22R, 32R and 36R narrows each of the channels in which they are disposed and creates a restriction to the flow of gas therethrough. The structures defining each of the flow restrictors may be provided on the surface of one (or both) of the plates that define any given channel, or in any other convenient manner.

As noted in connection with the discussion of a known ALD coating head as set forth in the Background portion of the application, the dimension of the gaps between the coating head and the substrate S must be rigorously controlled to insure that these dimensions remain relatively constant, since small changes in the dimension of a gap results in large changes in the flow. However, a coating bar in accordance with the present invention is able to maintain a substantially steady (i.e., variable but within tolerable process limits) flow of precursor material toward the substrate even if the dimension of the gap(s) 42 and/or 43 change(s).

The restriction in the precursor delivery channel 28 caused by the restrictor 28R presents a predetermined impedance $Z_{fc}$ to the precursor flow therethrough. In accordance with the present invention the restrictor 28R is sized such that the impedance $Z_{fc}$ is at least five (5) times the impedance $Z_g$. More preferably, the impedance $Z_{fc}$ is at least fifteen (15) times the impedance $Z_g$. By appropriately sizing the restriction 28R to exhibit a predetermined defined relationship between the flow impedance in the channel 28 with respect to the impedance in the gap $Z_g$ at the outlet of the channel 28 the delivery of the precursor is made independent from and tolerant of variations in the dimension of the gap 42. Precursor flow is therefore made substantially independent of the gap impedance $Z_g$.

Similarly, the presence of a restriction 36R in each of the inert gas delivery channels 36U, 36D presents a predetermined impedance $Z'_{fc}$ to the flow through these channels. The restrictor 36R in each of these channels 36U, 36D should also be sized such that the impedance $Z'_{fc}$ is at least five (5) times, and more preferably at least fifteen (15) times, the impedance $Z'_g$. Similarly, appropriately sizing each restriction 36R to exhibit a predetermined defined relationship between the flow impedance in its respective channel 36 with respect to the impedance in the gap $Z'_g$ at the outlet of each channel 36 the delivery of the inert gas delivery is made independent from and tolerant of variations in the dimension of the gap 42. Inert gas delivery flow is therefore made substantially independent of the gap impedance $Z'_g$.

The presence of the restriction 32R in each of the exhaust channels 32U, 32D presents a predetermined impedance $Z''_{fc}$ to the flow through these channels. These restrictors primarily enable control of the exhaust vacuum. Each restrictor 32R within each exhaust channel 32U, 32D is sized such that its impedance $Z''_{fc}$ is at least five (5) times larger than either the impedance $Z_g$ or the impedance $Z'_g$. More preferably, each impedance $Z''_{fc}$ is at least fifteen (15) times larger than either the impedance $Z_g$ or the impedance $Z'_g$. The restrictor in each exhaust channel is sized such that the friction factor f'' that is less than 100, and preferably less than 10.

In practice, ordinary design considerations that expedite manufacture (e.g., sizing all of the plates 22 that comprise the coating bar to be essentially identical) would be expected to result in the magnitude of these impedances $Z_g$ or $Z'_g$ being very similar, but are not necessarily identical.

The various impedances $Z_g$, $Z'_g$, $Z_{fc}$, $Z'_{fc}$ and $Z''_{fc}$ relate the volumetric flow Q through the gap or channel (as the case may be) to the pressure drop ΔP along the path of the fluid according to $$Q = \frac{\Delta P}{Z}. \tag{1}$$

Flow impedance is discussed in S. Dushman, *The Scientific Foundations of Vacuum Technique*, 2 Ed., John Wiley & Sons, New York, 1962.

The impedances $Z_{fc}$, $Z'_{fc}$ and/or $Z''_{fc}$ can also have friction factors f, f' and f'', respectively. Such friction factors f, f' and f'' relate the shear stress at the wall of a restriction $\tau_w$ to the kinetic energy K of the moving fluid according to $$\tau_w = fK \tag{2}.$$

The friction factor is discussed in F. A. Holland and R Bragg, *Fluid Flow for Chemical Engineers*, Elsevier, Amsterdam, 1995.

In accordance with the present invention the impedance $Z_{fc}$ in the precursor delivery channel has a friction factor less than 100, and more preferably less than 10. In addition, in accordance with the invention the impedance $Z'_{fc}$ in each inert gas delivery channel 36U, 36D and the impedance $Z''_{fc}$ in each exhaust channel 32U, 32D each have a friction factor less than 100, and more preferably less than 10.

The flow restrictors 28R, 32R and 36R, as the case may be, may take any convenient form. In the arrangement illustrated each flow restrictor takes the form of a rectanguloid projection that extends transversely across either one (or both) of the plates defining the particular delivery channel. In the preferred case the restrictor defines a flow restriction that extends the full transverse (Z direction of the bar). Preferably each flow restrictor 28R, 32R and 36R should include a transition surface 28T, 32T and 36T, respectively disposed at the end of the restrictor to minimize the formation of eddies in gas flow through the channel. The transition surface 28T, 32T and 36T may be planar, as illustrated. However, the shape of the surface may be otherwise configured. It should be noted that the transition surfaces 32T on the restrictor 32R in each exhaust channel 32U, 32D (as shown in FIG. 2) are not required for the performance of the apparatus 10, but may be included for manufacturing convenience.

Figure 4:
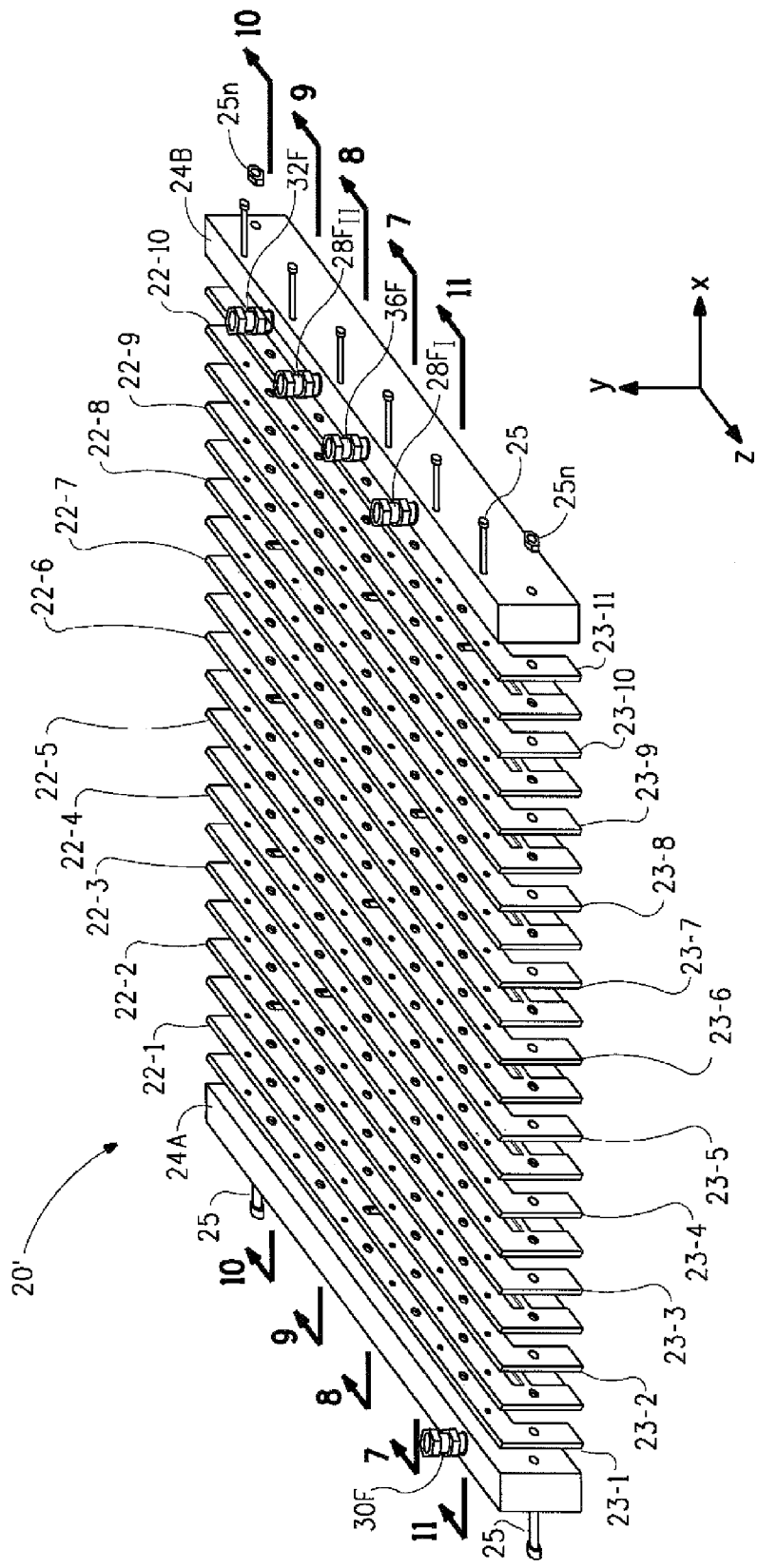
FIG. 4 is an exploded perspective view of a coating bar in accordance with the present invention adapted to deposit two precursor materials onto a substrate.

As noted earlier, a coating bar may contain multiple precursor deposition modules 21. FIG. 4 is an exploded perspective view of a coating bar 20' adapted to deposit two precursor materials (material "I" and material "II") on a substrate. In the particular construction illustrated the coating bar 20' is formed as a layered assembly comprising ten (10) structural plates 22 alternated between eleven (11) gaskets 23. The layered assembly is closed by end bar 24A, 24B secured by bolts 25 and nuts 25N.

Figure 5:
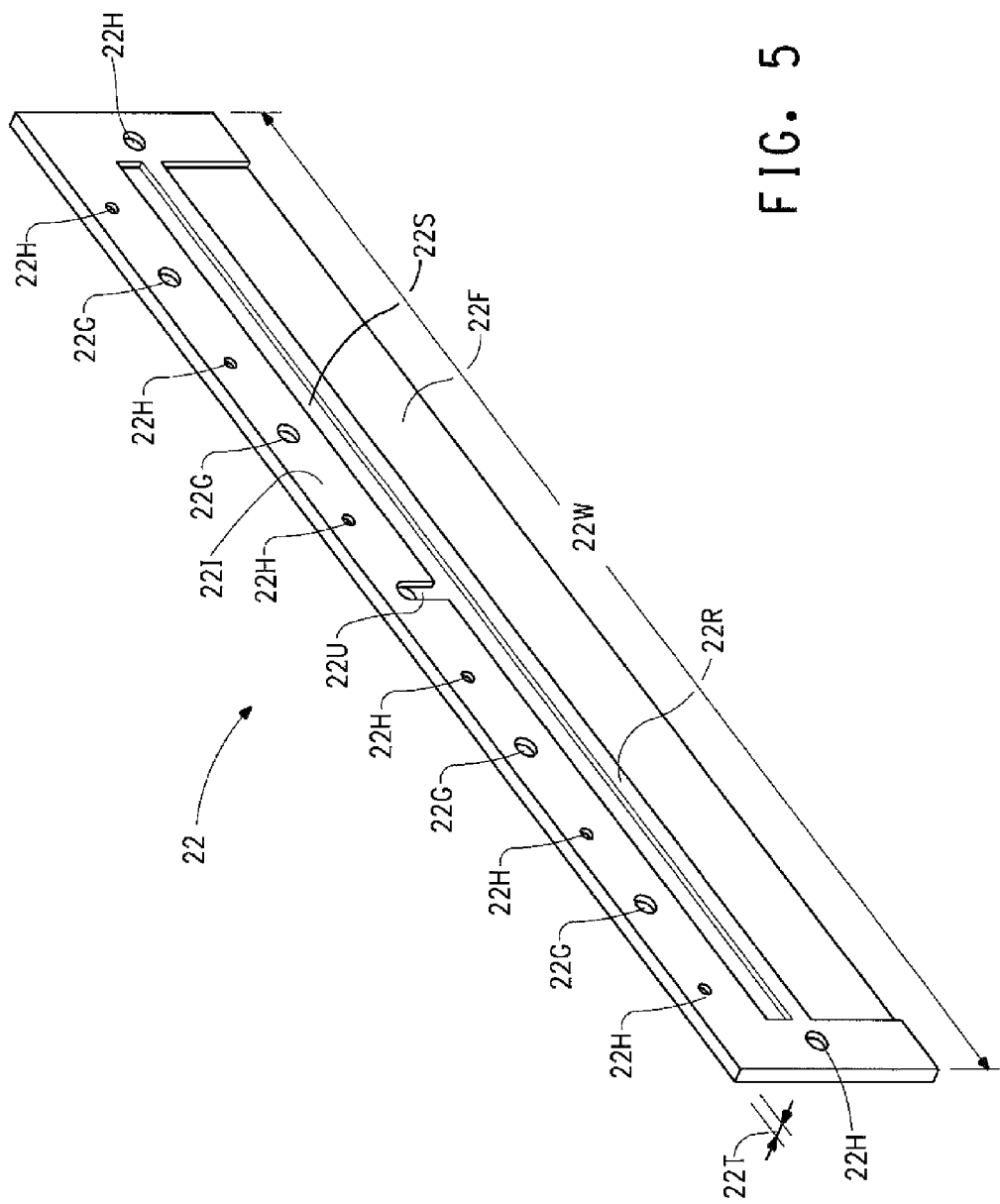
FIG. 5 is an isolated perspective view of the structure of a purge flow plate used to assemble the coating bar shown in FIG. 4.
Figure 6:
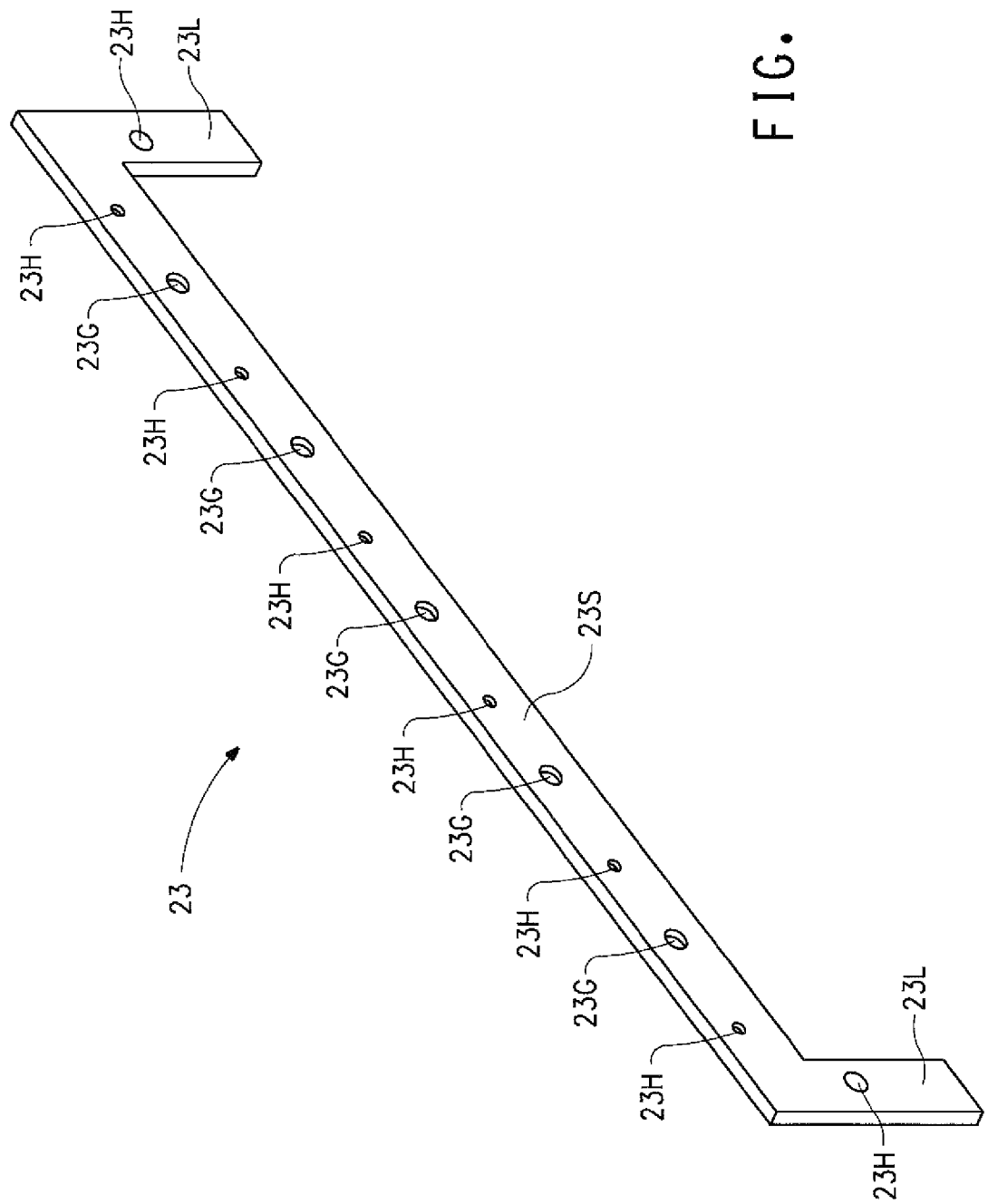
FIG. 6 is an isolated perspective view of a flow plate shim gasket used to assemble the coating bar shown in FIG. 4.
Figure 7:
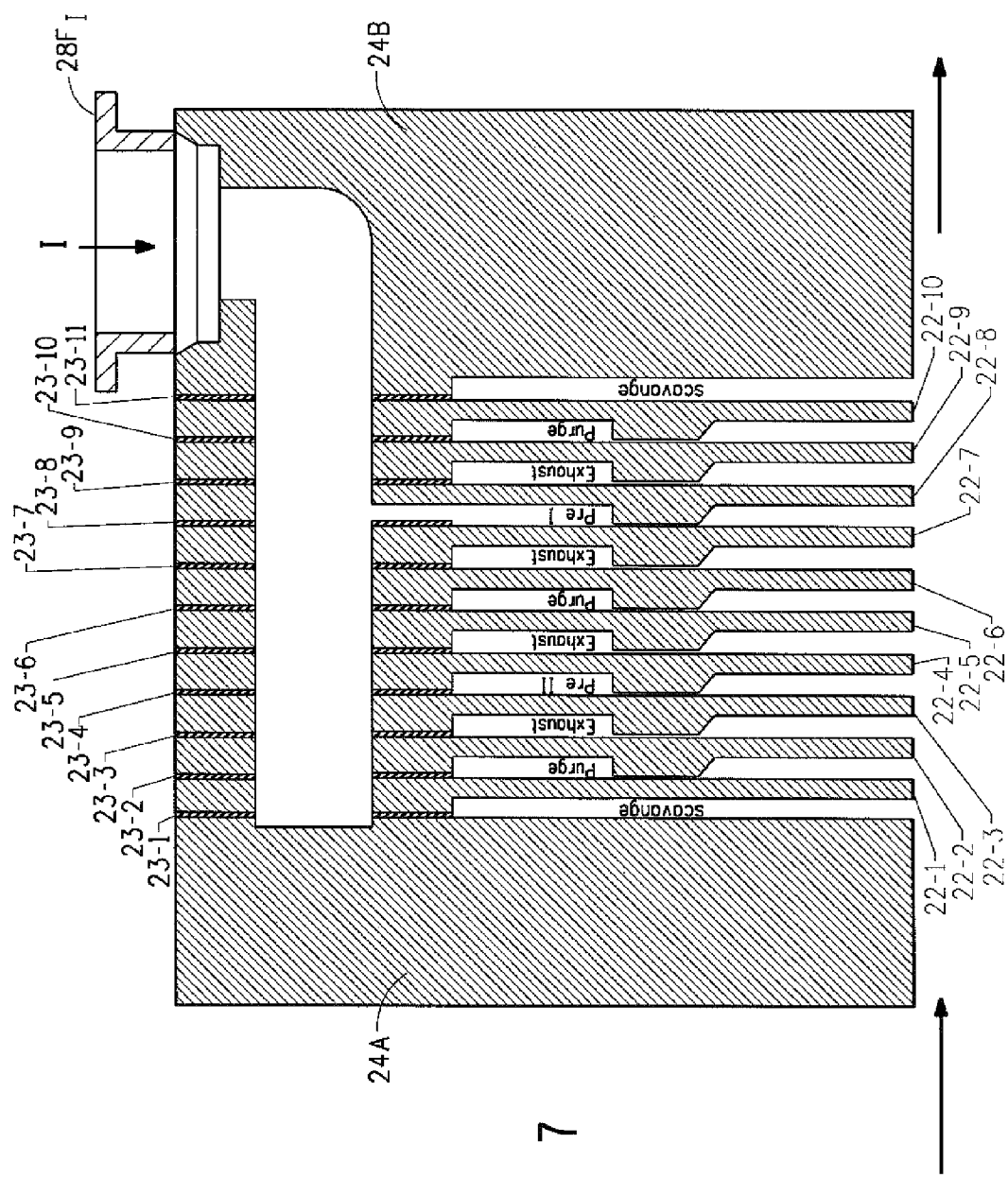
FIGS. 7 through 11 are side section views of an assembled coating bar of FIG. 4 respectively illustrating the flow paths through the bar for the inert (purge) gas (FIG. 7), exhaust (FIG. 8), precursor I (FIG. 9), precursor II (FIG. 10), and additional scavenger channels (FIG. 11)
Figure 8:
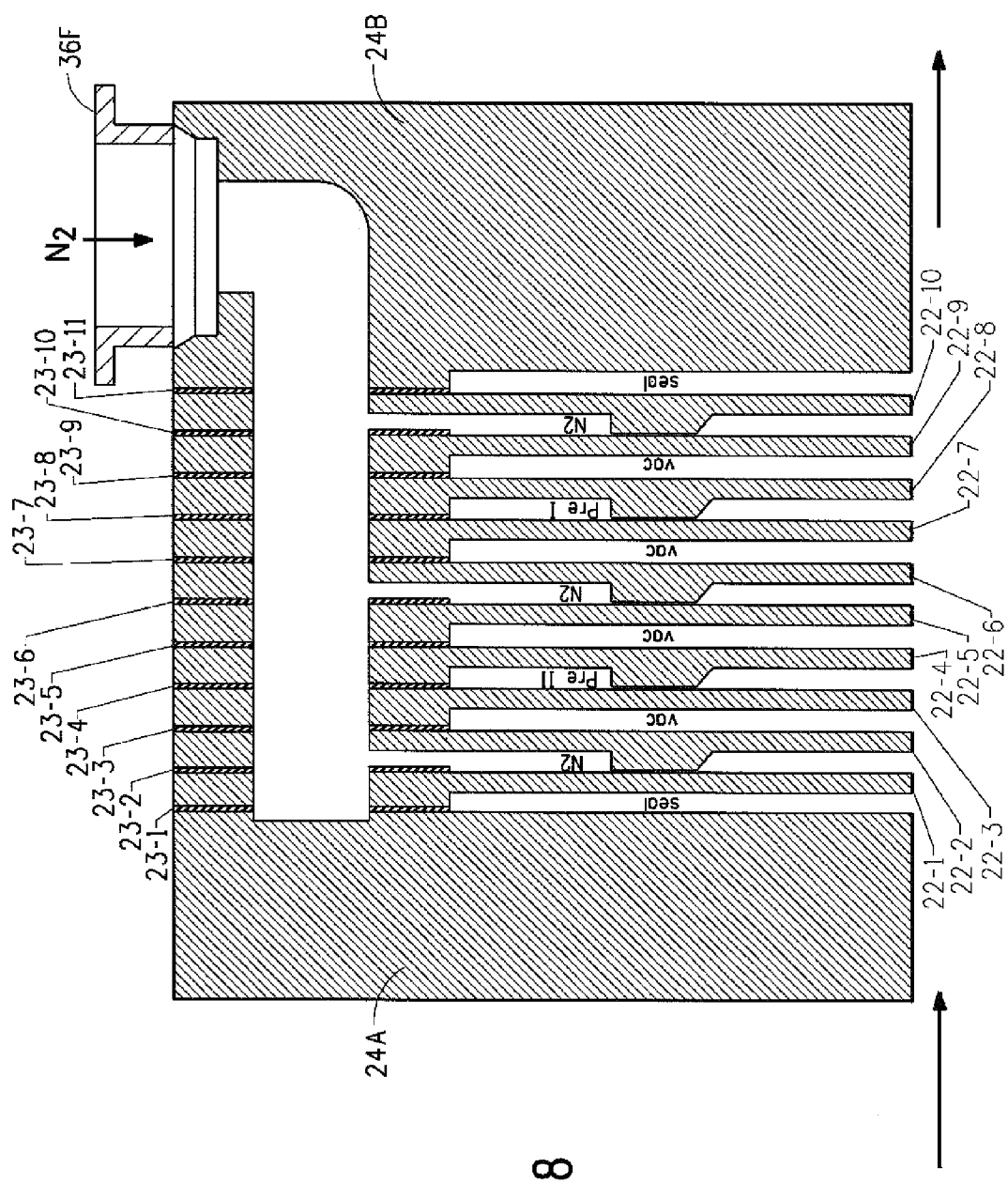
Figure 9:
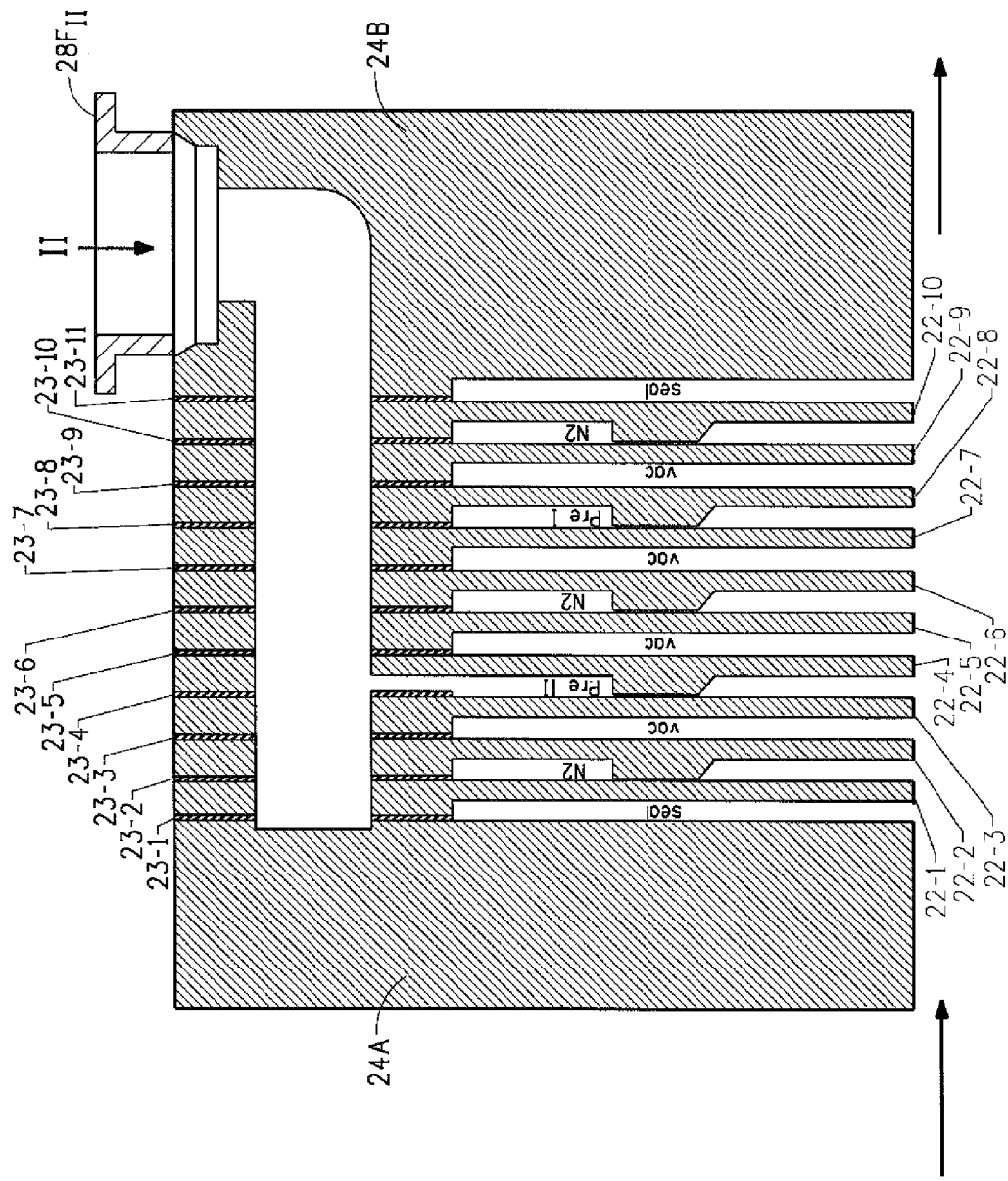
Figure 10:
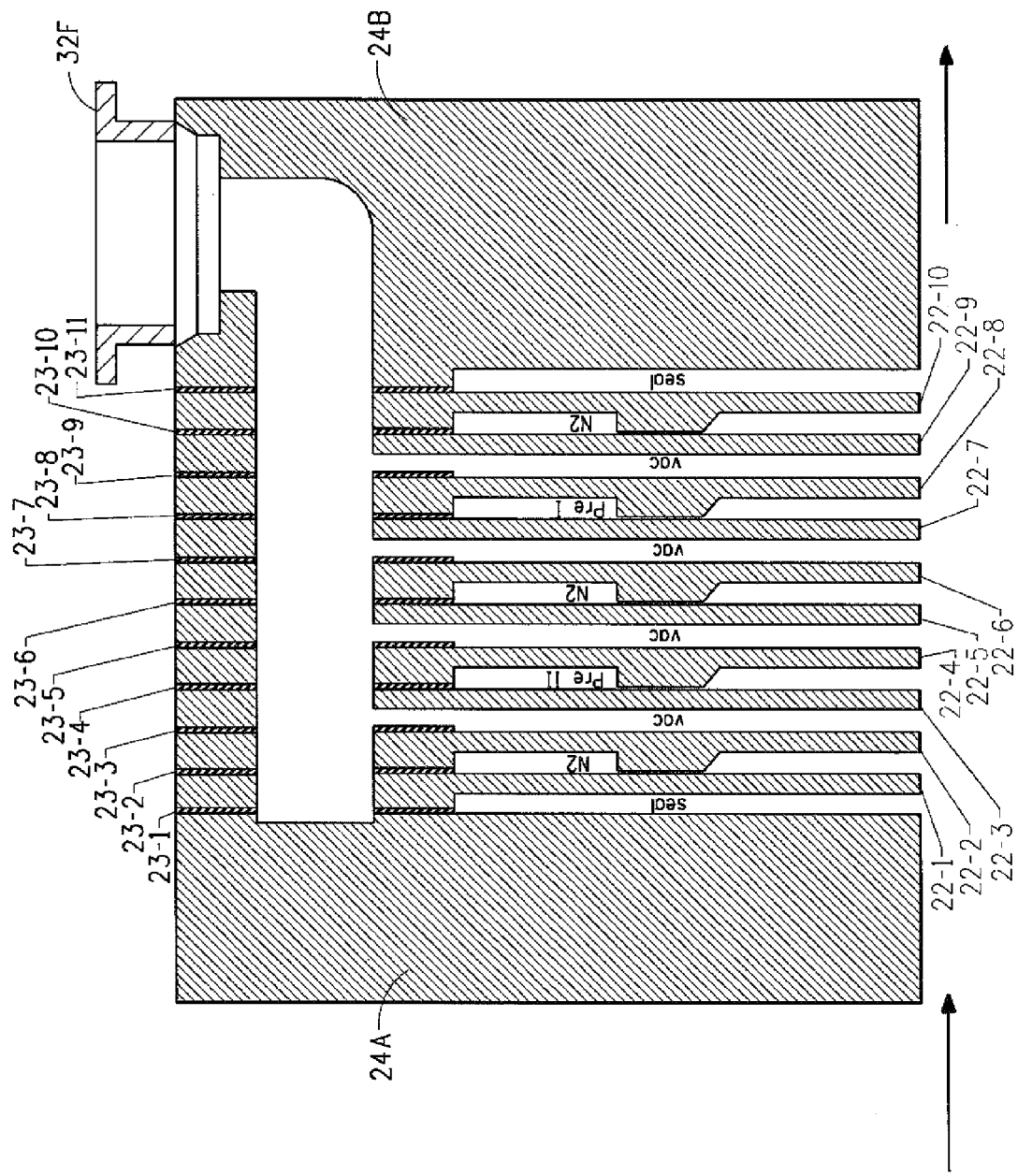

FIG. 5 is an isolated perspective view of an individual plate 22 while FIG. 6 shows an isolated perspective view of an individual gasket 23.

As seen from FIG. 5 each structural plate 22 is a generally planar member fabricated from any suitably rigid material compatible with the gases and temperatures associated with the ALD process. The plates are typically one to two millimeters (1-2 mm) in thickness. Each plate 22 has a header region 22I which exhibits the full thickness 22T of the plate. A full-thickness rectanguloid bar 22R extends across the full transverse dimension 22W of the plate 22. The bar portion 22R of the plate 22 serves to define the various restrictors in the various channels of the apparatus 10. Portions of one surface of each plate 22 above and below the restrictor bar 22R are relieved defining a transversely extending supply slot region 22S and a relatively enlarged flow region 22F. Appropriately positioned through openings 22G and holes 22H are provided in the header region 22H of the plate. A furrow 22U defines a transport passage that connects one of the openings in each plate 22 with the supply slot region 22S therein.

As seen in FIG. 6 an individual gasket 23 is a generally C-shaped member fabricated from a suitable polymer material. Each gasket has a transversely extending spacer portion 23S having appropriately positioned through openings 23G and holes 23H therein. Legs 23L depend from each end of the spacer portion 23S.

As shown from the exploded view of FIG. 4 and the section views of FIGS. 7-11 delivery modules 21, 21' for each of two precursors (material "I" and material "II", respectively) are formed by stacking ten (10) structural plates 22-1 through 22-10 alternated intermediately between eleven gaskets 23-1 through 23-11.

As is apparent from FIG. 4 when the layered stack is so formed the holes 22H, 23H in each of the plates 22 and gaskets 23 register to define holes that receive bolts 25 thereby to the secure the stack to the end bars 24A, 24B.

Appropriate ones of the through openings 22G, 23G in the plates 22 and gaskets 23 respectively register with each other to define supply headers that extend appropriate predetermined distances into the bar 20'. The supply headers communicate with fittings provided on one of the ends bar 24A, 24B.

The relieved supply slot region 22S and enlarged flow region 22F in one surface of each plate confront the opposed surface of the adjacent plate to define the various delivery and exhaust channels present in the bar 20'. The furrow 22U in each plate connects the supply slot in that plate to the appropriate passage formed in the bar. The presence of a gasket 23 intermediate between adjacent plates 22 serves to space the bar 22R on the surface of one plate away from the opposite surface of the adjacent plate, thereby defining the restrictor in each of the various channels. The impedances and friction factor of a restrictor 28R, 32R and 36R may be determined from a measurement of both the pressure drop across the restriction and the mass flow through it, the equipment and methods necessary for such a measurement being well known. The value of the impedance of a restrictor may be adjusted by changing the thickness of the associated gasket 23.

Figure 11:
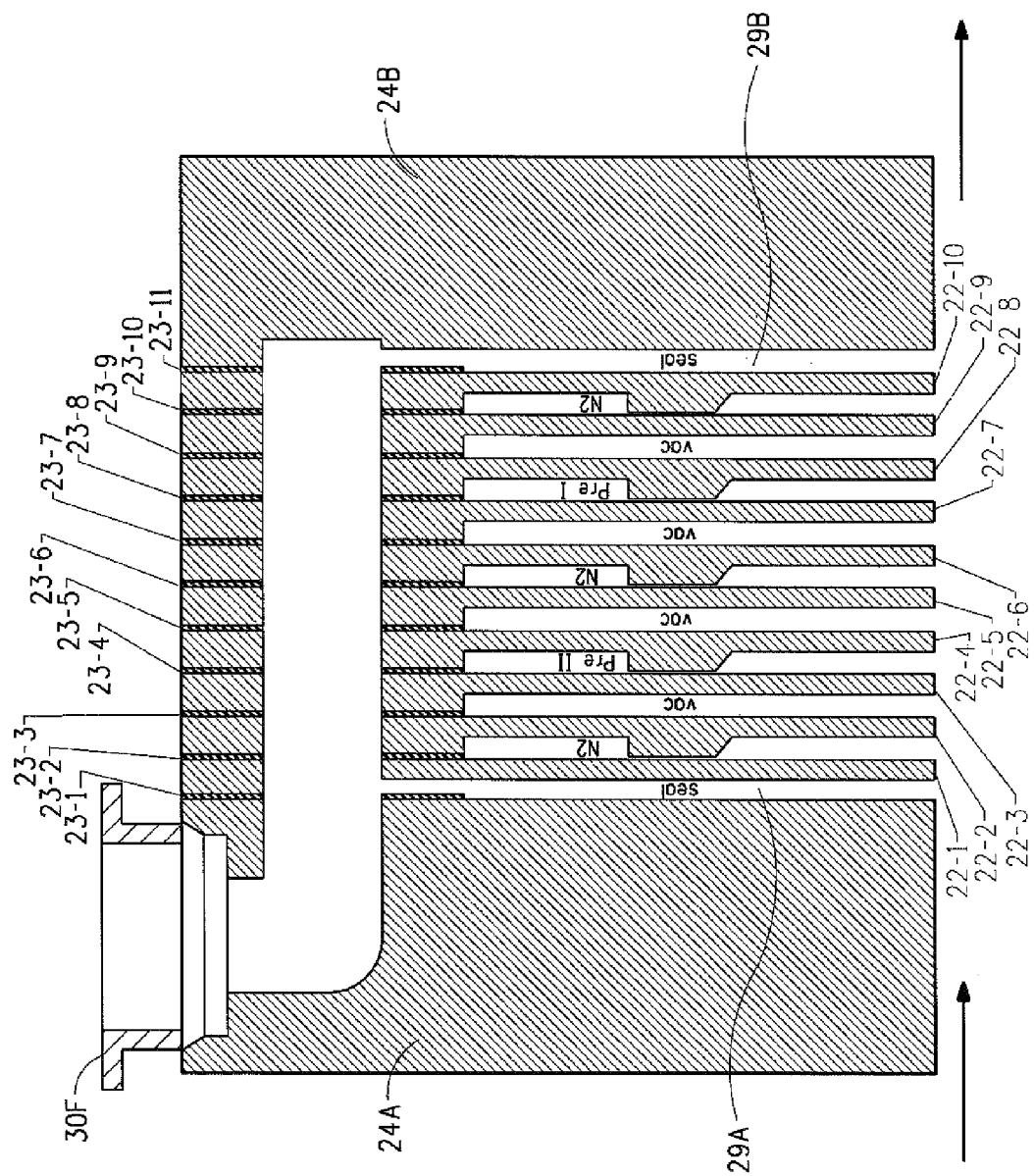

FIG. 11 illustrates additional scavenger channels 29A, 29B that are disposed adjacent the end bars 24A, 24B, respectively. These additional exhaust channels 29A, 29B serve to scavenge any residual precursor gases from the gap between the coating bar 20' and the substrate S and convey them to a discharge fitting 30F.

Figure 12:
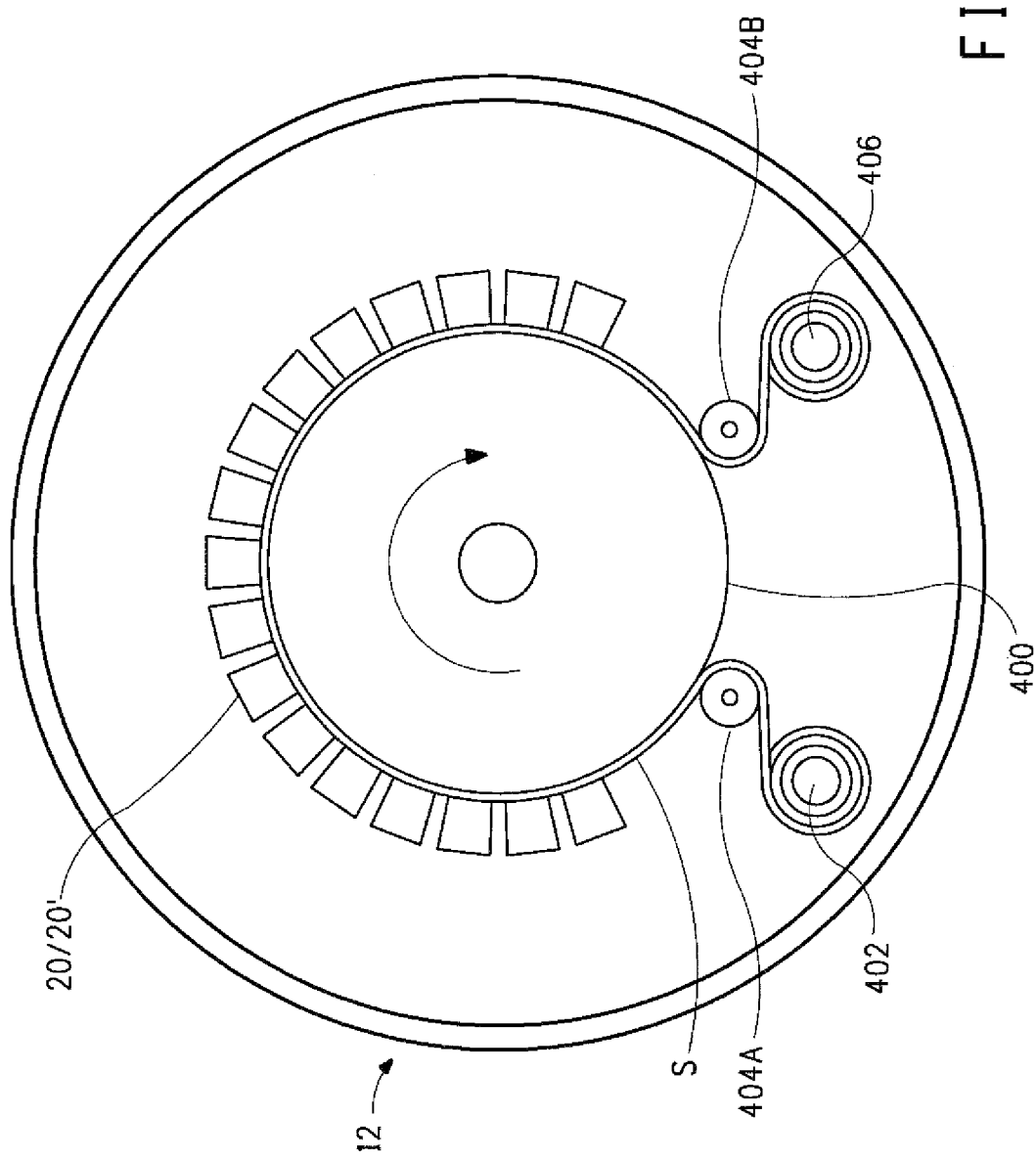
FIG. 12 is a diagrammatic representation of an apparatus for continuous flow atomic layer deposition of material(s) on a moving substrate using one or more coating bar(s) of the present invention wherein the path of travel of the substrate through the apparatus is curved.

Since the delivery of precursor material is independent of the gap dimension, the path of travel of the substrate can be curved. FIG. 12 is a stylized diagrammatic view of a ALD apparatus in which a substrate S is carried by a circular drum 400 along a curved path from an input roll 402, over idler rolls 404A, 404B, to an output roll 406. The path takes the form of the Greek symbol "Omega". As seen, one or more bars 20, 20' can be disposed along the path of travel.

If the radius of curvature of the curved path is sufficiently large, and/or if the individual coating bars are sufficiently narrow, the output face of the coating bar whereby the precursor and purge gases emerge need not be shaped to match the curve. If, however, such is not the case, the individual plates 22 may be shaped such that the gaps 42 and 43 remain constant across the output face of the bar without adversely impacting the performance of the apparatus.

Since the path of travel for the substrate may be curved, this coating apparatus is well suited to atomic layer deposition on both rigid and flexible substrates. Rigid substrates may include, but are not limited to, rigid polymer, glass, metal, or ceramic plates or sheets. Rigid polymer substrates may be filled with particles or fibers which enhance the materials properties or functionality of the material. Suitable flexible substrates may be flexible metal foils, polymer films, and flexible glass membranes. Suitable polymer films include, but are not limited to, polyethylene terephthalate, polyethylene naphthalate, polyethylene tetrafluoride, ethylene tetrafluoroethylene, fluorinated ethylene propylene, polynorbornene, polyethersulfone, polycarbonate, or polyimide.

Said substrates, whether rigid or flexible, may have been previously treated by plasma or corona, or they may have been exposed to a vapor which adheres to the substrate and modifies its surface properties.

The substrates, both rigid and flexible, may have previously deposited layers thereon. Such layers may be uniform coatings, either metallic, insulating, or semiconducting, or may be a multilayer stack of several materials. The deposition of such layers may have been effected by any of the known methods for forming thin layers on substrates, whether from liquid or vapor, under vacuum conditions or not. These previously deposited layers can be patterned, or may even be complete electronic circuits such as a photovoltaic cell or a transistor backplane for an active matrix display.

The precursor gases used with the claimed apparatus may be used to coat the substrate with materials which include, but are not limited to, metal oxides, metal nitrides, metal carbides, metal oxynitrides, and metal oxyborides. In general, any material that can be deposited by atomic layer deposition can be deposited using this apparatus. Suitable materials for atomic layer deposition are discussed by R. L. Puurunen in the Journal of Applied Physics, volume 97, page 121301 (2005).

The coating applied with this apparatus may be of a single material, or it may be a multilayer stack. Such a stack may consist of only two layers, a first layer of material A, followed by a second layer of material B. The layers may be of similar thickness, or one may be thinner. For example, material A could be deposited first as an adhesion or stress relieving layer, with the bulk of the coating comprised of material B. Alternatively, material A may comprise the bulk of the coating, and a second layer of material B may serve as a thin capping or protective layer. It should be appreciated that the approach could be extended to three or more materials to form a structure of the form ABC, and to repeating structures of the form ABABAB . . . or ABCABCABC . . . or to structures in which only some layers repeat, such as ABCBC . . . BCBCD.

EXAMPLES

The operation of an atomic layer deposition apparatus having a coating bar in accordance with the present invention may be understood more clearly from the following Examples.

Example 1

A coating bar capable of depositing a single precursor layer according to the embodiment of FIGS. 1 and 2 was investigated using a finite element numerical model. The boundaries of this model were largely defined by the plates which comprise the coating bar, and by the substrate. For that reason FIG. 13, which shows the region of space constituting the model, is rendered as the negative of FIG. 2.

This model included a single precursor delivery channel (28) flanked by a pair of exhaust channels (32U, 32D). The exhaust channels were flanked by a pair of inert gas delivery channels (36U, 36D). The gap (42) was defined between a flat substrate S and the end of the precursor delivery channel. Finally, the module was flanked with a pair of wider regions (50, FIG. 13) to correspond with the disposition of the coating bar in a surrounding atmosphere of inert gas.

The vertically disposed fluid delivery and exhaust channels had a width w=1 mm, except in the region of the flow restrictions. The channels were separated by solid plates of thickness t=1 mm. The substrate surface, designated E, was disposed a distance g=0.1 mm below the output face of the bar.

Figure 13:
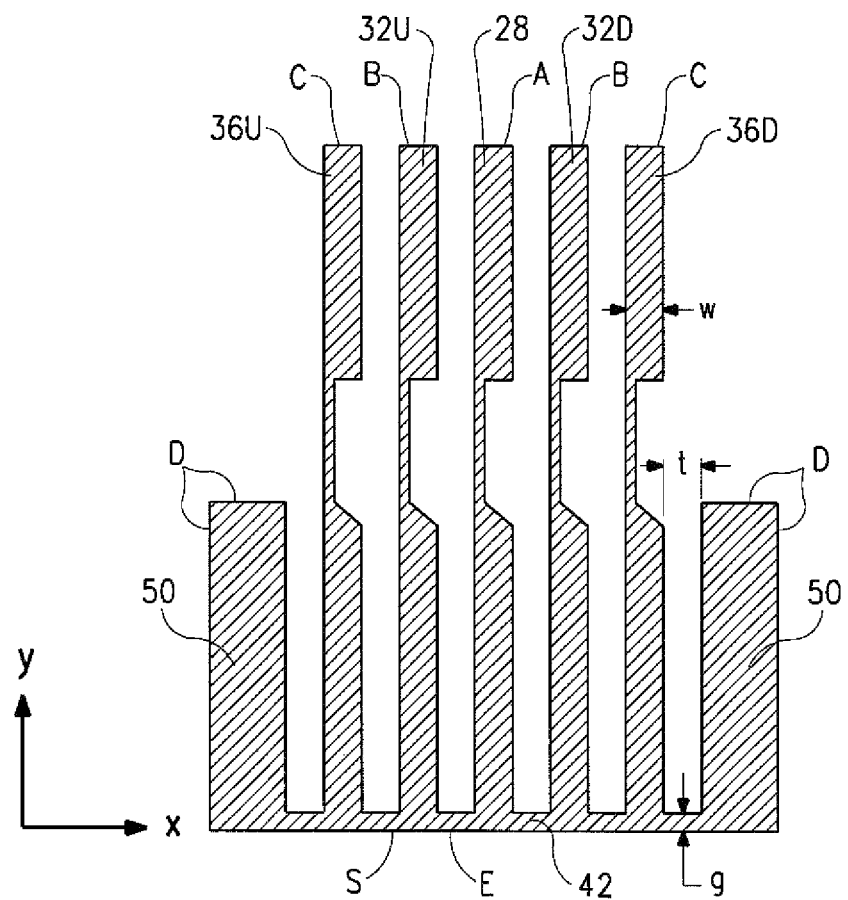
FIG. 13 shows the region of space constituting the model of Example 1 rendered as the negative of the structure of FIG. 2.

The open volume in the model was considered to be filled with a fluid having the properties of nitrogen gas at a temperature of 373 K. This gas was considered to be an Incompressible Navier-Stokes fluid and, in the bulk, to obey the equations:

$$\rho(\vec{u} \cdot \vec{\nabla})\vec{u} = \vec{\nabla} \cdot [-pI + \mu(\vec{\nabla}\vec{u} + (\vec{\nabla}\vec{u})^T)] \quad \text{(E1.1a)}$$

$$\vec{\nabla} \cdot \vec{u} = 0 \quad \text{(E1.1b)}$$

where $\rho$ is the fluid density, $\vec{u}$ is the fluid velocity, and $\mu$ is the fluid viscosity. I is the identity tensor. In order to solve any system of equations within a defined region, the behavior on the boundaries that define the region must be specified. In FIG. 13, the heavy line surrounding the shaded area constitutes the boundary to the modeled region. Certain segments of these boundaries are denoted by the letters A through E, as these boundaries require specifications different from those of the unlabeled sections. The boundaries indicated by the letters A through D on FIG. 13 represent inlets and outlets where fluid could pass into or out of the model. Boundary A was the precursor inlet (corresponding to the inlet end 281 of the channel 28), the boundaries B were the fluid exhausts (corresponding to the exhaust ends 32E of the channels 32U, 32D), and the boundaries C were the purge inlets (corresponding to the supply ends 36S of the channels 36U, 36D). The external boundaries D of the wider regions 50 represent the divide between regions of the atmosphere around the module that were modeled, and regions that were not.

Along these boundaries, the conditions on the fluid entering or leaving the modeled region were given by $$\mu(\vec{\nabla}\vec{u}+(\vec{\nabla}\vec{u})^T)\hat{n}=0 \tag{E1.2a}$$

$$p=\text{constant} \tag{E1.2b}$$

where $\hat{n}$ is an inward pointing unit vector normal to the boundary. Along each indicated boundary, the pressure was held constant at the value given in Table E1.1.

TABLE E1.1

| Boundary | Pressure (Pa) |
|---|---|
| A | 101000 |
| B | 100500 |
| C | 99975 |
| D | 100000 |

All of the remaining boundaries with the exception of E (i.e. all the unlabeled boundaries), represented physical walls where the well known no slip boundary condition, $\vec{u}=0$, was applied. The last boundary, indicated as E, represented the substrate. Here also the no slip condition was applied: the velocity of the fluid with respect to the substrate was taken as zero at the line of contact, but the substrate itself was in motion with speed $v_0$ directed in the positive x direction, so that the calculated fluid flow would be correct for a coating bar in close proximity to a moving substrate.

Transport of the precursor within the fluid was calculated according to the convection and diffusion equation.

$$\frac{\partial c}{\partial t}+\vec{\nabla}\cdot(-D_{12}\vec{\nabla}c)-\vec{u}\cdot\vec{\nabla}c=0, \tag{E1.3}$$

where c is the molar concentration of precursor dispersed in the inert carrier gas, and the fluid velocity is given by the solution to Eq. E1.1, with the boundary conditions discussed. $D_{12}$ the diffusion coefficient for the precursor in the carrier gas. This quantity was taken as $$D_{12}=\frac{D^*}{P}, \tag{E1.4}$$

with a value for D*, calculated according to J. C. Slattery and R. B. Bird (*A. I. Ch. E. journal* vol. 4, p. 137, 1958) for a trimethylaluminum precursor in a nitrogen carrier gas, of 1.2 Pa-m²/s.

The boundary condition for Equation E1.3 along all unlabeled boundaries in FIG. 13 was $$\hat{n}\cdot(-D_{12}\vec{\nabla}c+c\vec{u})=0 \tag{E1.5}$$

which specifies that no precursor may be carried through these boundaries. The condition along boundary A was taken as $$\hat{n}\cdot(-D_{12}\vec{\nabla}c+c\vec{u})=c_0 u_y(x) \tag{E1.6}$$

representing an inward flux of precursor at a concentration $c_0$ of 1 molar %/Along B, C, and D, the boundary condition was taken as $$\hat{n}\cdot(-D_{12}\vec{\nabla}c)=0 \tag{E1.7}$$

This so called convective flux condition allowed precursor to be carried in or out across the boundary as the local values for the concentration and the fluid velocity indicated. Finally, along E, the boundary condition was taken as $$\hat{n}\cdot(-D_{12}\vec{\nabla}c+c\vec{u})=-k_s\sigma c(\theta_0-c_s) \tag{E1.8}$$

where $c_s$ is the surface concentration (mol/m²) of precursor already chemically bound to the substrate, $\theta_0$ is the surface concentration of a completed monolayer of precursor, $\sigma$ is the probability that a precursor molecule striking the surface will react and bind rather than deadsorbing, and $k_s$ is the surface rate constant.

The rate constant was calculated from elementary kinetic theory (F. Reif, *Fundamentals of Statistical and Thermal Physics*, McGraw-Hill, New York, 1965) to be $k_s=2.27\times10^6$ m³ mol⁻¹ s⁻¹. The sticking probability was taken as (C. Soto and W. T. Tysoe, J. Vac. Sci. Technol. A, vol. 9, p. 2686, 1991) $\sigma=0.01$, and $\theta_0$ was calculated from the known density of ALD deposited $Al_2O_3$ films (Groner et al., *Chem. Mater.* vol. 16, p. 639, 2004) to be $2.66\times10^{-5}$ mol/m². Eq. E1.7 therefore gives a flux of precursor leaving the gas phase to deposit on to the substrate.

On the substrate surface, the concentration of deposited precursor was given by the solution to the equation $$\frac{\partial c_s}{\partial t}=-v_0\frac{\partial c_s}{\partial x}+k_s\sigma c(\theta_0-c_s), \tag{E1.9}$$

with the point boundary conditions $$\frac{\partial c_s}{\partial t}=0 \tag{E1.10}$$

at x=0 (the left-hand end of boundary E in FIG. 13), and $$\frac{\partial c_s}{\partial t}=-v_0 c_s \tag{E1.11}$$

at x=15 mm (the right- and end of boundary E in FIG. 13 E1.1).

For the purposes of computational efficiency, the system of equations was solved in a two step process. First the Navier-Stokes component only was solved as a stationary problem, then the full coupled system of equations was solved as a transient problem. The initial conditions for the fluid flow in the transient problem were taken from the solution to the stationary problem. The initial condition for the convection-diffusion component was c=0 everywhere. The initial condition for the deposited precursor was $c_s=0$ all along boundary E.

Figure 14:
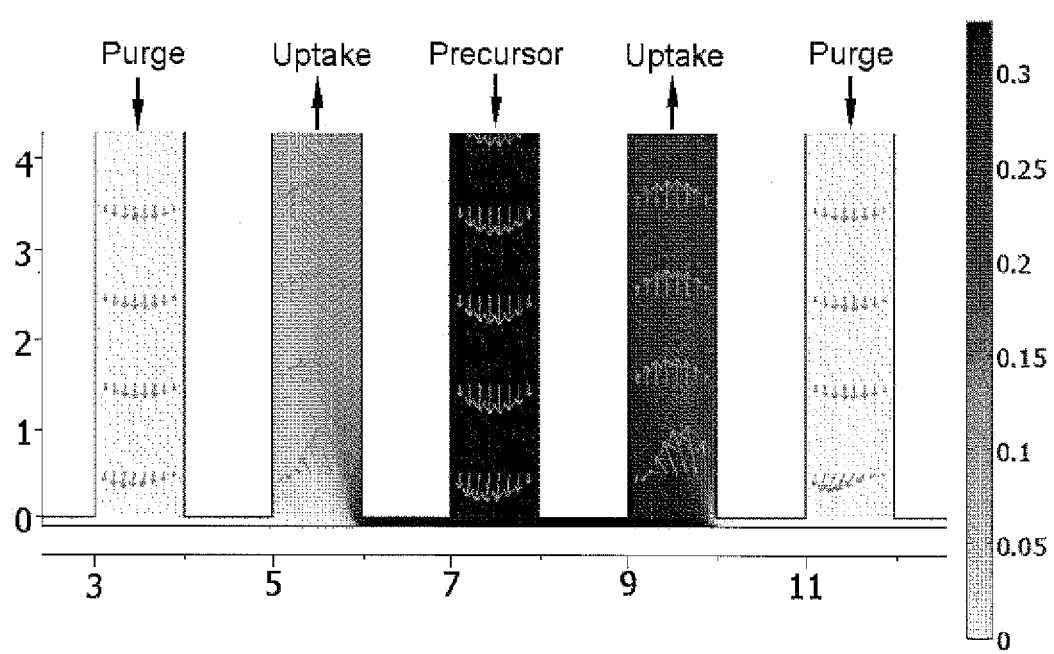
FIG. 14 indicates the status of the model of Example 1 at time t=0.2 s after the start of the calculation.

FIG. 14 E1.2 indicates the status of the model at time t=0.2 seconds(s) after the start of the calculation (in model time, not computation time). The concentration of precursor in the fluid is shown as a gray scale. The vertical and lateral positions within the model are given in millimeters (mm), and the concentration is given in mol/m³. In addition, the local direction and relative magnitude of the fluid velocity is indicated with arrows for some locations. At this point in time the concentration profile was stable, having reached a steady state at about t=0.14 s. It is apparent from the FIG. 14 that the precursor concentration is zero in the region of the purge channels, the combination of the purges and the exhaust flows acting to completely confine the precursor to the central region of the model.

Figure 15:
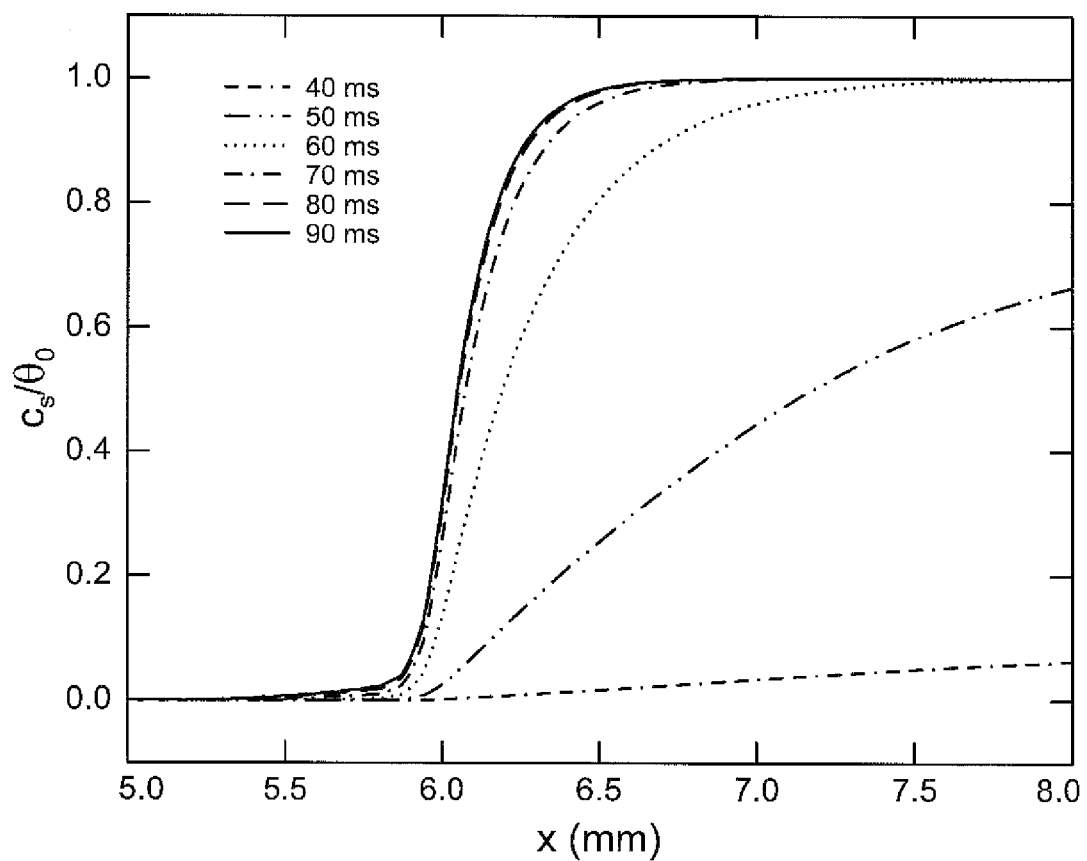
FIG. 15 shows a the surface concentration of reacted precursor as a function of lateral position on the substrate boundary E of the model of Example 1.

FIG. 15 shows the surface concentration of reacted precursor as a function of lateral position on the substrate boundary E. The concentration profile is shown at several different times, as indicated by the legend. For later times, the profile is indistinguishable from the profile at t=90 ms. The data are normalized by the maximum concentration, so a maximally covered surface is represented by a value of 1. A particular spot on the moving substrate passes under the upstream edge of the bar at x=2 mm with a surface concentration $c_s$=0. As this spot progresses from x=5 mm to x=7 mm, it rapidly becomes covered with precursor, and exits from under the bar at x=13 mm with a saturated coating.

Example 2

Figure 16:
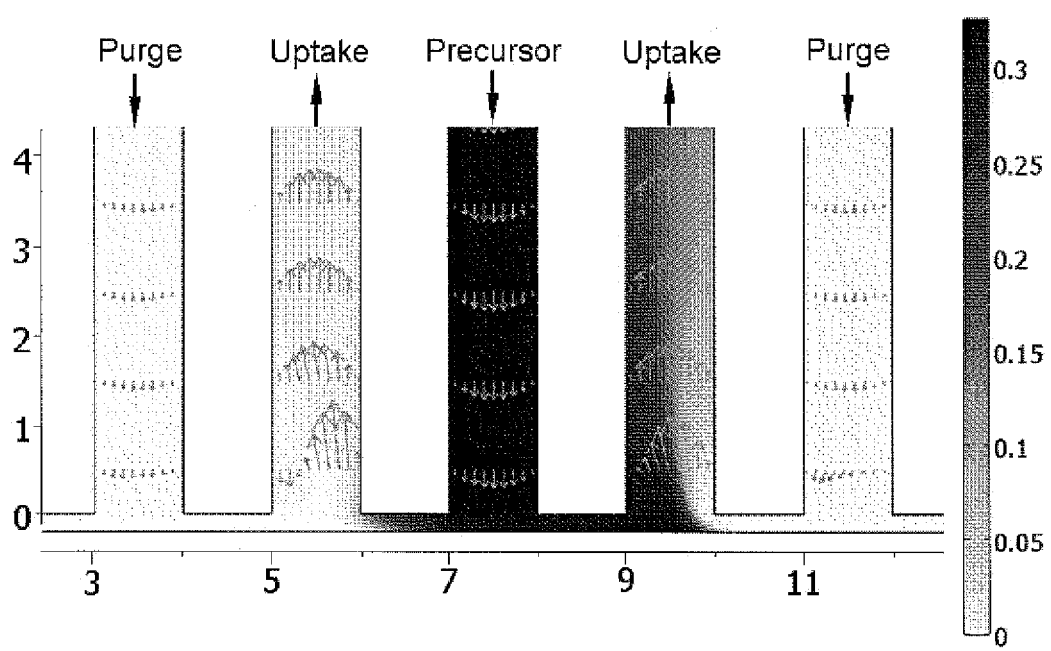
FIG. 16 is a view similar FIG. 14, but indicates the status of the model of Example 2 at time t=0.2 s after the start of the calculation.

The coating bar of Example 1 was analyzed in the case that the substrate was disposed a distance g=0.2 mm below the output face of the bar. All other particulars of the analysis remain the same as in Example 1. FIG. 16 shows the same view as FIG. 14, but for the case of Example 2. There are minor differences in the concentration profile and fluid flow, as compared to Example 1, but the essential particular, the confinement of the precursor to the central region of the model, remains unaffected.

Figure 17:
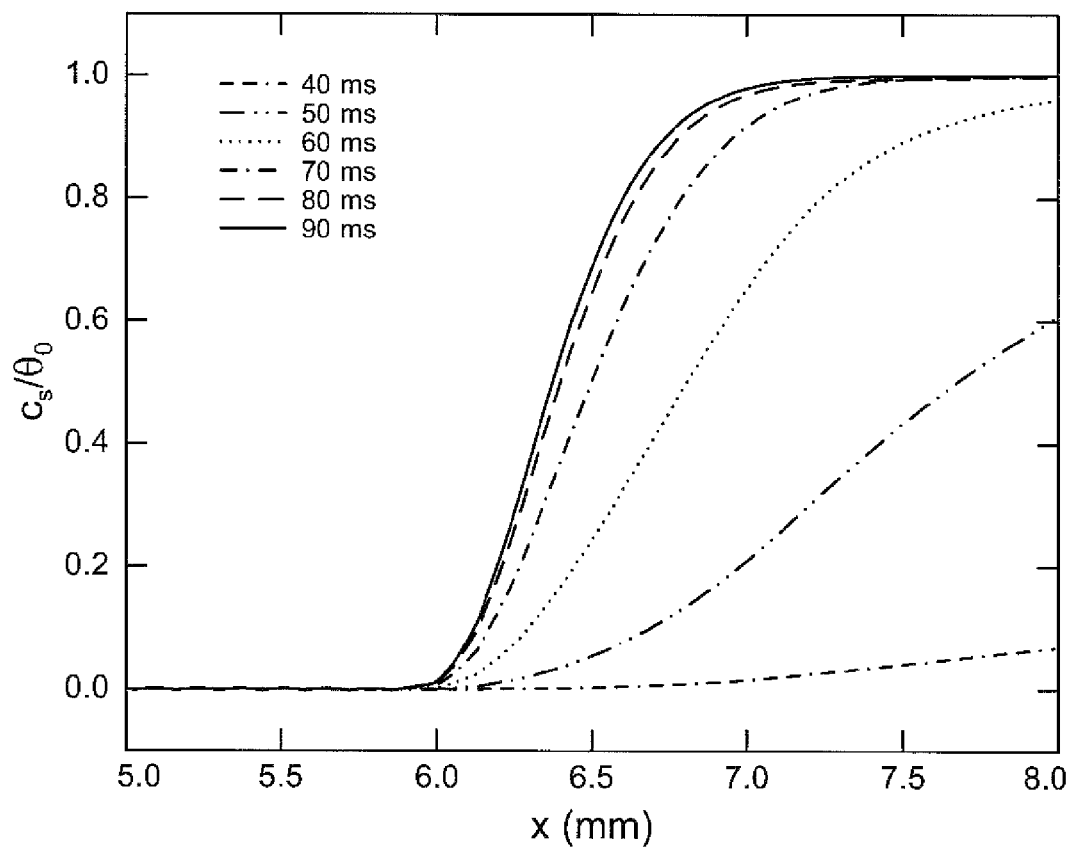
FIG. 17 is a view similar FIG. 15, and shows the surface concentration of reacted precursor as a function of lateral position on the substrate boundary E of the model of Example 2.

FIG. 17 shows the same view as FIG. 15, but for the case of Example 2. As in the previous example, a steady state coating profile has been achieved by t=90 ms. Full coverage is obtained. The main difference with Example 1 is that the region in which the coating takes place has shifted a fraction of a millimeter in the downstream direction.

Taken together these examples show that the deposition as performed by an apparatus having the impedances having the relations as defined herein and friction factors in the ranges as defined herein is insensitive to moderate variations in the separation between the coating bar and the substrate. The variation in g from Example 1 to Example 2 is of a size that might reasonably be expected in a mechanical apparatus containing moving or translating parts. For example, if the substrate was held to a rotating drum, as in FIG. 12, g might vary by 0.1 mm due to a lack of perfect concentricity in the drum or its mounting.

Those skilled in the art, having the benefit of the teachings of the present invention as hereinabove set forth may effect numerous modifications thereto. Such modifications are to be construed as lying within the contemplation of the present invention as defined by the appended claims.

What is claimed is:

1. Apparatus for atomic layer deposition of a material on a moving substrate, the apparatus comprising:
   a conveying arrangement for moving a substrate along a predetermined path of travel through the apparatus; and
   a coating bar having at least one precursor delivery channel and first and second inert gas delivery channels defined therein,
   the precursor delivery channel having an upstream and a downstream side relative to the path of travel of the substrate, an outlet end, and a precursor flow restrictor disposed therewithin, the precursor delivery channel being adapted to conduct a precursor fluid containing a material to be deposited on the substrate with the precursor flow restrictor presenting a predetermined impedance $Z_{fc}$ to the flow through the precursor delivery channel, the flow through the impedance $Z_{fc}$ having a friction factor f, and
   the first and second inert gas delivery channels being respectively disposed on the upstream and downstream sides of the precursor delivery channel, each having an outlet end and an inert gas flow restrictor therewithin, and each of the inert gas delivery channels being adapted to conduct an inert fluid toward the substrate with the inert gas flow restrictor presenting a predetermined impedance $Z'_{fc}$ to the flow through the respective inert gas delivery channel, the flow through the impedance $Z'_{fc}$ having a friction factor f';
   so that, when the apparatus is in use, a substrate movable along the path of travel defines a gap between the substrate and the outlet ends of the precursor delivery channel and each inert gas delivery channel, and the gap defines an impedance $Z_g$ to a flow of fluid from the precursor delivery channel and an impedance $Z'_g$ to a flow of fluid from each inert gas delivery channel,
   wherein the precursor restrictor and the inert gas restrictors are sized such that the impedance $Z_{fc}$ is at least five (5) times the impedance $Z_g$, the friction factor f is less than 100, the impedance $Z'_{fc}$ is at least five (5) times the impedance $Z'_g$, and f' is less than 100, with the gap ranging from 0.1 mm to 0.2 mm,
   so that during continuous flow operation of the apparatus for atomic layer deposition the flow of the precursor fluid and the flow of the inert fluid are tolerant of dimensional variations in the gap and a steady-state coating profile is attained.

2. The apparatus of claim 1 wherein
   the coating bar has first and second exhaust channels defined therein, each exhaust channel being interposed between the precursor delivery channel and one of the inert gas delivery channels, and
   each exhaust channel having an inlet end, the inlet end of each exhaust channel being in fluid communication with both the gap having the impedance $Z_g$ and with the gap having the impedance $Z'_g$ so that each exhaust channel is adapted to conduct fluid from both the precursor delivery channel and from one of the inert gas delivery channels away from the path of travel;
   wherein the coating bar further comprises:
   a flow restrictor disposed within each exhaust channel, each flow restrictor presenting a predetermined impedance $Z''_{fc}$ to the flow in the respective exhaust channel,
   the flow through the impedance $Z''_{fc}$ having a friction factor f'',
   each restrictor within each exhaust channel being sized such that its impedance $Z''_{fc}$ is at least five (5) times larger than either the impedance $Z_g$ or the impedance $Z'_g$ when the apparatus is continuously operated for atomic layer deposition with the gap ranging from 0.1 mm to 0.2 mm, and
   the friction factor f'' is less than 100.

3. The apparatus of claim 1 wherein the restrictor in the precursor delivery channel is sized such that the impedance $Z_{fc}$ is at least fifteen (15) times the impedance $Z_g$.

4. The apparatus of claim 1 wherein the restrictor in each inert gas delivery channel is sized such that the impedance $Z'_{fc}$ is at least fifteen (15) times the impedance $Z'_g$.

5. The apparatus of claim 4 wherein the restrictor in the precursor delivery channel is sized such that the impedance $Z_{fc}$ is at least fifteen (15) times the impedance $Z_g$.

6. The apparatus of claim 2 wherein the restrictor in each exhaust channel is sized such that its impedance $Z''_{fc}$ is at least fifteen (15) times larger than either the impedance $Z_g$ or the impedance $Z'_g$.

7. The apparatus of claim 6 wherein the restrictor in the precursor delivery channel is sized such that the impedance $Z_{fc}$ is at least fifteen (15) times the impedance $Z_g$.

8. The apparatus of claim 6 wherein the restrictor in each inert gas delivery channel is sized such that the impedance $Z'_{fc}$ is at least fifteen (15) times the impedance $Z'_g$.

9. The apparatus of claim 8 wherein the restrictor in the precursor delivery channel is sized such that the impedance $Z_{fc}$ is at least fifteen (15) times the impedance $Z_g$.

10. The apparatus of claim 6 wherein the restrictor in the precursor delivery channel is sized such that the impedance $Z_{fc}$ is at least fifteen (15) times the impedance $Z_g$, and wherein the restrictor in each inert gas delivery channel is sized such that the impedance $Z'_{fc}$ is at least fifteen (15) times the impedance $Z'_g$.

11. The apparatus of claim 1 wherein the friction factor f is less than 10.

12. The apparatus of claim 1 wherein the friction factor f' is less than 10.

13. The apparatus of claim 12 wherein the friction factor f is less than 10.

14. The apparatus of claim 2 wherein the friction factor f" is less than 10.

15. The apparatus of claim 14 wherein the friction factor f is less than 10.

16. The apparatus of cam 14 wherein the friction factor f' is less than 10.

17. The apparatus of claim 16 wherein the friction factor f is less than 10.

18. The apparatus of claim 14 wherein the friction factor f is less than 10 and wherein the friction factor f' is less than 10.

19. The apparatus of claim 1 wherein the path of travel of the substrate through the apparatus is curved.

20. The apparatus of claim 1 wherein the path of travel of the substrate through the apparatus is planar.

* * * * *